(12) United States Patent
Chien et al.

(10) Patent No.: US 7,379,722 B2
(45) Date of Patent: May 27, 2008

(54) FREQUENCY ALLOCATION USING A SINGLE VCO

(75) Inventors: Hung-Ming Chien, Irvine, CA (US); Keith A. Carter, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 521 days.

(21) Appl. No.: 11/060,325

(22) Filed: Feb. 17, 2005

(65) Prior Publication Data

US 2006/0057992 A1    Mar. 16, 2006

Related U.S. Application Data

(60) Provisional application No. 60/609,550, filed on Sep. 13, 2004, provisional application No. 60/609,549, filed on Sep. 13, 2004.

(51) Int. Cl.
*H04B 1/16* (2006.01)
*H04B 1/06* (2006.01)

(52) U.S. Cl. .................. 455/196.1; 455/255; 455/258

(58) Field of Classification Search ............... 455/146, 455/147, 196.1, 208, 209, 255, 264, 550.1, 455/258, 552.1; 331/14, 16, 17, 25
See application file for complete search history.

(56) References Cited

U.S. PATENT DOCUMENTS

| 6,005,443 | A * | 12/1999 | Damgaard et al. ............ 331/14 |
| 6,611,175 | B2 * | 8/2003 | Heymann ...................... 331/2 |
| 6,766,178 | B1 * | 7/2004 | Damgaard et al. ....... 455/552.1 |
| 7,190,236 | B2 * | 3/2007 | Lee et al. ............... 331/117 R |

* cited by examiner

*Primary Examiner*—Sonny Trinh
(74) *Attorney, Agent, or Firm*—Garlick Harrison & Markison (57) ABSTRACT

An apparatus and method to use a single voltage controlled oscillator (VCO) to generate frequencies to cover multiple frequency bands. The single VCO generates local oscillator signals for more than one frequency band of a communication standard or protocol, such as the IEEE 802.11 standard.

14 Claims, 10 Drawing Sheets

| CHANNEL | VCO FREQ | N FOR $F_{VCO}/2$ | | | N FOR $F_{VCO}$ | | |
|---|---|---|---|---|---|---|---|
| | | @6.667 MHz (÷3) | @3.333 MHz (÷6) | @1.667 MHz (÷12) | @6.667 MHz (÷3) | @3.333 MHz (÷6) | @1.333 MHz (÷15) |
| 4920MHz | 3280.0MHz | 246 | 492 | 984 | 492 | 984 | 2460 |
| 4940 | 3293.3 | 247 | 494 | 988 | 494 | 988 | 2470 |
| 4960 | 3306.7 | 248 | 496 | 992 | 496 | 992 | 2480 |
| 4980 | 3320.0 | 249 | 498 | 996 | 498 | 996 | 2490 |
| 5000 | 3333.3 | 250 | 500 | 1000 | 500 | 1000 | 2500 |
| 5020 | 3346.7 | 251 | 502 | 1004 | 502 | 1004 | 2510 |
| 5040 | 3360.0 | 252 | 504 | 1008 | 504 | 1008 | 2520 |
| 5060 | 3373.3 | 253 | 506 | 1012 | 506 | 1012 | 2530 |
| 5080 | 3386.7 | 254 | 508 | 1016 | 508 | 1016 | 2540 |
| 5100 | 3400.0 | 255 | 510 | 1020 | 510 | 1020 | 2550 |

300 TABLE FOR 802.11a LOWER BAND

FIG. 6

| CHANNEL | VCO FREQ | N FOR $F_{VCO}/2$ | | | N FOR $F_{VCO}$ | | |
|---|---|---|---|---|---|---|---|
| | | @6.667 MHz (÷3) | @3.333 MHz (÷6) | @1.667 MHz (÷12) | @6.667 MHz (÷3) | @3.333 MHz (÷6) | @1.333 MHz (÷15) |
| 5725MHz | 3816.7MHz | 286.25 | 572.5 | 1145 | 572.5 | 1145 | 2862.5 |
| 5745 | 3830.0 | 287.25 | 574.5 | 1149 | 574.5 | 1149 | 2872.5 |
| 5765 | 3843.3 | 288.25 | 576.5 | 1153 | 576.5 | 1153 | 2882.5 |
| 5785 | 3856.7 | 289.25 | 578.5 | 1157 | 578.5 | 1157 | 2892.5 |
| 5805 | 3870.0 | 290.25 | 580.5 | 1161 | 580.5 | 1161 | 2902.5 |
| 5825 | 3883.3 | 291.25 | 582.5 | 1165 | 582.5 | 1165 | 2912.5 |
| 5850 | 3900.0 | 292.5 | 585 | 1170 | 585 | 1170 | 2925 |
| 5860 | 3906.7 | 293 | 586 | 1172 | 586 | 1172 | 2930 |
| 5870 | 3913.3 | 293.5 | 587 | 1174 | 587 | 1174 | 2935 |
| 5880 | 3920.0 | 294 | 588 | 1176 | 588 | 1176 | 2940 |
| 5890 | 3926.7 | 294.5 | 589 | 1178 | 589 | 1178 | 2945 |
| 5900 | 3933.3 | 295 | 590 | 1180 | 590 | 1180 | 2950 |

400 TABLE FOR 802.11a UPPER BAND

FIG. 7

| CHANNEL | VCO FREQ | N FOR F_VCO/2 | | | | N FOR F_VCO | | |
|---|---|---|---|---|---|---|---|---|
| | | @3.333 MHz (÷6) | @1.333 MHz (÷15) | @0.667 MHz (÷30) | @6.667 MHz (÷3) | @3.333 MHz (÷6) | @1.333 MHz (÷15) |
| 2412MHz | 3216.0MHz | 482.4 | 1206 | 2412 | 482.4 | 964.8 | 2412 |
| 2417 | 3222.7 | 483.4 | 1208.5 | 2417 | 483.4 | 966.8 | 2417 |
| 2422 | 3229.3 | 484.4 | 1211 | 2422 | 484.4 | 968.8 | 2422 |
| 2427 | 3236.0 | 485.4 | 1213.5 | 2427 | 485.4 | 970.8 | 2427 |
| 4432 | 3242.7 | 486.4 | 1216 | 2432 | 486.4 | 972.8 | 2432 |
| 2437 | 3249.3 | 487.4 | 1218.5 | 2437 | 487.4 | 974.8 | 2437 |
| 2442 | 3256.0 | 488.4 | 1221 | 2442 | 488.4 | 976.8 | 2442 |
| 2447 | 3262.7 | 489.4 | 1223.5 | 2447 | 489.4 | 978.8 | 2447 |
| 2452 | 3269.3 | 490.4 | 1226 | 2452 | 490.4 | 980.8 | 2452 |
| 2457 | 3276.0 | 491.4 | 1228.5 | 2457 | 491.4 | 982.8 | 2457 |
| 2462 | 3282.7 | 492.4 | 1231 | 2462 | 492.4 | 984.8 | 2462 |
| 2467 | 3289.3 | 493.4 | 1233.5 | 2467 | 493.4 | 986.8 | 2467 |
| 2472 | 3296.0 | 494.4 | 1236 | 2472 | 494.4 | 988.8 | 2472 |
| 2477 | 3302.7 | 495.4 | 1238.5 | 2477 | 495.4 | 990.8 | 2477 |
| 2484 | 3312.0 | 496.8 | 1242 | 2484 | 496.8 | 993.8 | 2484 |

500 TABLE FOR 802.11b/802.11g BAND

FREQUENCY ALLOCATION USING A SINGLE VCO

CROSS REFERENCE TO RELATED APPLICATION

This application claims the benefit of priority to the following U.S. provisional patent applications:
1) U.S. Provisional Patent Application Ser. No. 60/609,550; filed Sep. 13, 2004; and titled "Frequency Allocation Using A Single VCO" and
2) U.S. Provisional Patent Application Ser. No. 60/609,549; filed Sep. 13, 2004; and titled "Frequency Synthesizer Using PLL Architecture," of which both are incorporated herein by reference.

BACKGROUND OF THE INVENTION

1. Technical Field of the Invention

The embodiments of the invention relate to communication devices and more particularly to a voltage controlled oscillator (VCO) based synthesizer implemented within such communication devices that uses a single VCO for generating local oscillation frequencies.

2. Description of Related Art

Communication systems are known to support wireless and wire lined communications between wireless and/or wire lined communication devices. Such communication systems range from national and/or international cellular telephone systems to the Internet to point-to-point in-home wireless networks. Communication systems typically operate in accordance with one or more communication standards. For instance, wired communication systems may operate according to one or more versions of the Ethernet standard, the System Packet Interface (SPI) standard, or various other standards. Wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). Typically, the transceiver includes a data modulation stage and an RF stage. The data modulation stage (baseband process) converts between data and baseband signals in accordance with the particular wireless communication standard. The RF stage (transmitter section and receiver section) converts between baseband signals and RF signals. The RF stage may be a direct conversion transceiver that converts directly between baseband and RF or may include one or more intermediate frequency stages.

Wireless devices typically operate within certain RF frequency ranges established by one or more communications standards or protocols. A local oscillator generally provides a local oscillation signal that is used to mix with received or transmitted signals in the modulation/demodulation stages. A synthesizer may be used to set the frequencies to drive the local oscillator to provide the desired frequencies for mixing, in which the desired frequencies are generally based on the channel frequencies established for the particular standard or protocol.

When synthesizers are designed to provide certain frequencies, phase locked loops (PLLs) may be used to control the frequency. Some problems encountered with PLL related technology include the phase noise not being sufficiently low, reference frequency for phase frequency detection not being sufficiently high, which may result in smaller loop bandwidth, and the phase noise from a voltage controlled oscillator (VCO) not having sufficient filtering. In some synthesizers, multiple VCOs may be employed to generate local oscillation signals for frequency channels that are separated in different bands.

Although PLLs have been utilized in various capacities to control frequencies, there is a need to improve the architecture for providing PLLs in frequency ranges employed by wireless communication devices and standards to increase performance and/or to alleviate or reduce some of the problems noted above. Furthermore, when communication devices employ capabilities to operate using more than one communication standard or frequency band, it may be advantageous to utilize one circuitry to provide for the more than one standard or frequency band. For example, many communication devices are designed to operate using different frequency channels of the 802.11 standard, such as 802.11a, 802.11b and 802.11g. Instead of having different circuitry to provide for different bands of channel frequencies, it may be advantageous to have a single circuit to provide for these frequency requirements.

SUMMARY OF THE INVENTION

The present invention is directed to apparatus and methods of operation that are further described in the following Brief Description of the Drawings, the Detailed Description of the Embodiments of the Invention, and the claims. Other features and advantages related to the embodiments of the present invention will become apparent from the following detailed description of the embodiments of the invention made with reference to the accompanying drawings.

A scheme to provide a particular frequency allocation using a PLL architecture in a communication device. The frequency allocation is based on utilizing a single voltage controlled oscillator (VCO) to generate local oscillator signals for more than one frequency band of a communication standard or protocol. One such protocol is the IEEE 802.11 standard, in which the VCO generates a VCO output of frequency $F_{VCO}$, which is then applied to generate oscillator signals for channel frequencies of 802.11a and 802.11 b/g.

In one embodiment, a first divide by two circuit is coupled to receive the VCO output $F_{VCO}$ and performs a divide by two operation to output a ½ $F_{VCO}$ signal. A mixer is coupled to receive the VCO output of $F_{VCO}$ and ½ $F_{VCO}$ signal from the first divider and to mix and generate a 1.5 $F_{VCO}$ signal at the mixer output as a first oscillator signal. A second divide by two circuit is coupled to receive the 1.5 $F_{VCO}$ signal from the mixer and to perform a divide by two operation to output a ¾ $F_{VCO}$ signal as a second oscillator signal. In order to process 802.11a and 802.11b/g bands, in one embodiment $F_{VCO}$ is set to operate in the approximate range of 3.2 to 3.9 GHz, so that the first oscillator signal has a frequency in the approximate range of 4.9 to 5.9 GHz and the second oscillator signal has a frequency in the approximate range of 2.4 to 2.5 GHz.

DETAILED DESCRIPTION OF THE EMBODIMENTS OF THE INVENTION

The embodiments of the present invention may be practiced in a variety of settings that implement a phase locked loop (PLL) based frequency synthesizer and, in particular, a PLL that is used to control synthesized frequencies which determine the operation of a local oscillator in a communication device or system.

Figure 1:
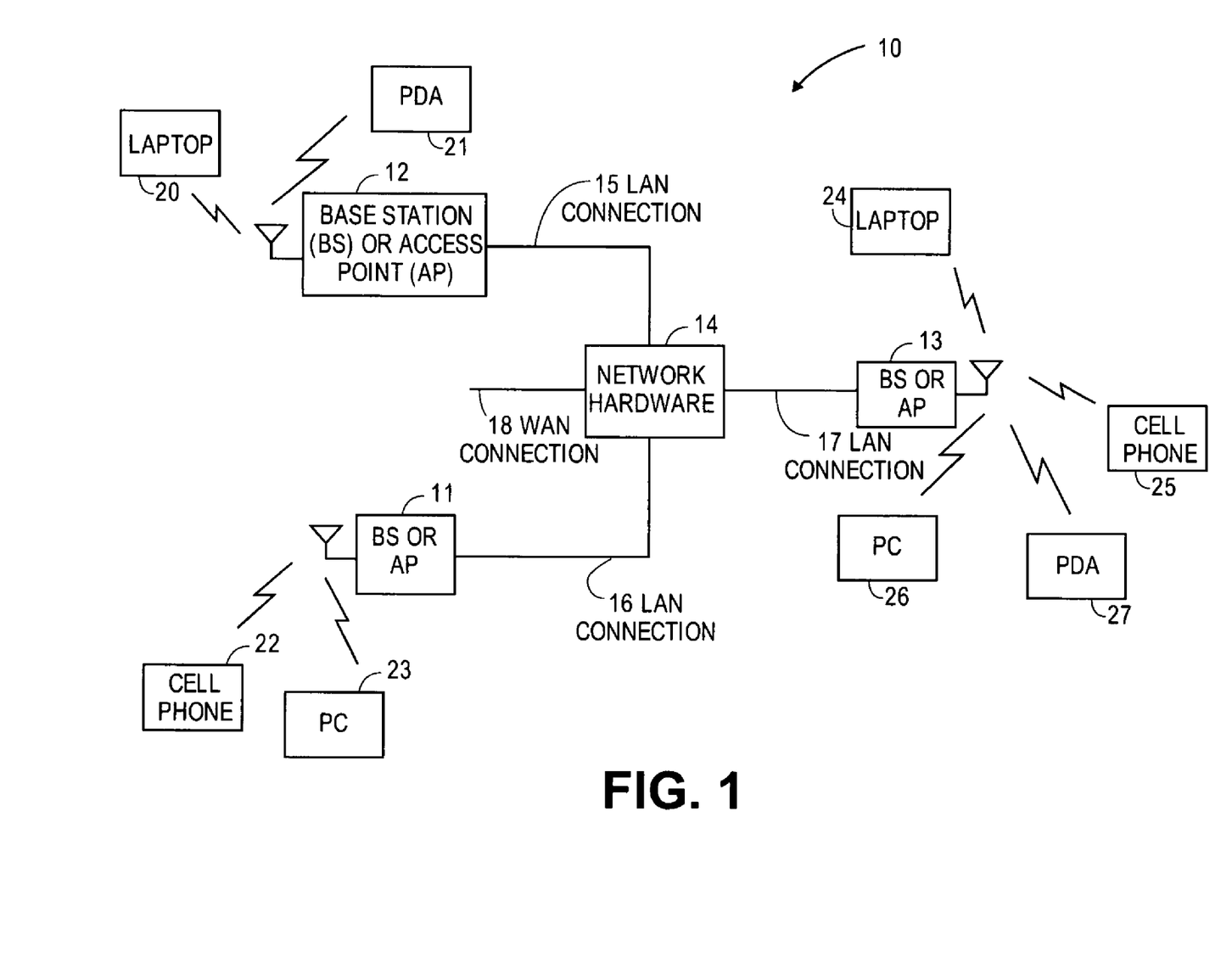
FIG. 1 is a block schematic diagram illustrating a wireless communication system in accordance with one embodiment of the present invention.

FIG. 1 is a schematic block diagram illustrating a communication system 10 that includes a plurality of base stations (BS) and/or access points (AP) 11-13, a plurality of wireless communication devices 20-27 and a network hardware component 14. The wireless communication devices 20-27 may be laptop host computers 20 and 24, personal digital assistant hosts 21 and 27, personal computer hosts 23 and 26, cellular telephone hosts 22 and 25, and/or any other type of device that supports wireless communications. The details of the wireless communication devices will be described with reference to FIG. 2.

The base stations or access points 11-13 may be operably coupled to network hardware 14 via respective local area network (LAN) connections 15-17. Network hardware 14, which may be a router, switch, bridge, modem, system controller, et cetera, may provide a wide area network (WAN) connection 18 for communication system 10. Individual base station or access point 11-13 generally has an associated antenna or antenna array to communicate with the wireless communication devices in its area. Typically, the wireless communication devices register with a particular base station or access point 11-13 to receive services within communication system 10. For direct connections (i.e., point-to-point communications), wireless communication devices may communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers to enhance performance, reduce costs, reduce size, and/or enhance broadband applications.

Figure 2:
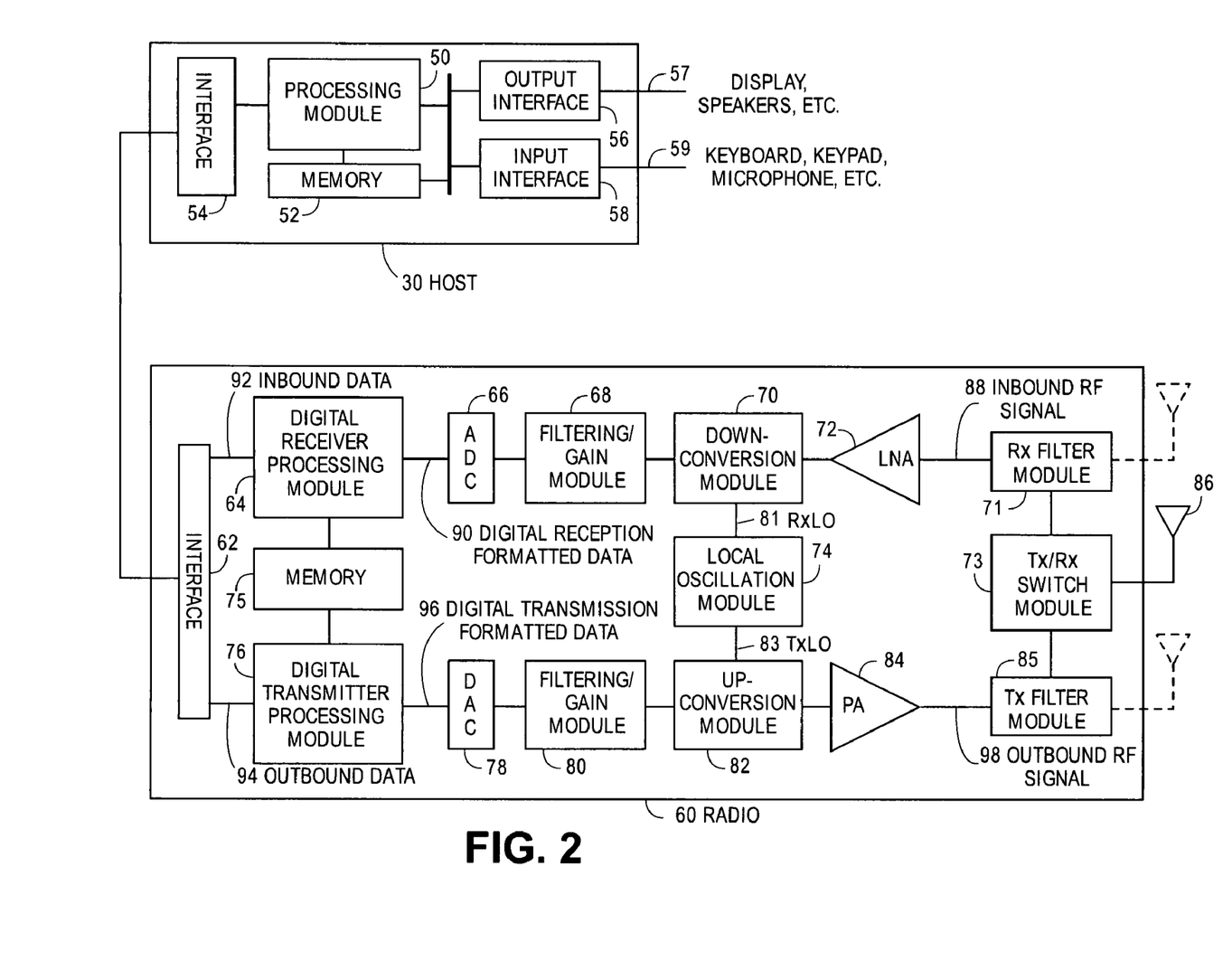
FIG. 2 is a schematic block diagram illustrating a wireless communication device in accordance with one embodiment of the present invention.

FIG. 2 is a schematic block diagram illustrating a wireless communication device that includes a host unit 30 and an associated radio unit 60. Host unit 30 may be incorporated in a communication device, such as one or more of the wireless communication devices 20-27 shown in FIG. 1. For cellular telephone hosts, radio 60 is typically a built-in component. For personal digital assistants hosts, laptop hosts, and/or personal computer hosts, radio 60 may be built-in or may be an externally coupled component that couples to host device 30 via a communication link, such as a PCI interface, PCMCIA interface, USB interface, or another type of interface.

As illustrated, host device 30 includes a processing module 50, memory 52, radio interface 54, input interface 58, and output interface 56. Processing module 50 and memory 52 execute corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For inbound data received from radio 60, radio interface 54 provides the data to processing module 50 for further processing and/or routing to output interface 56. Output interface 56 provides connectivity to an output display device 57, such as a display, monitor, speakers, et cetera, such that the received data may be displayed or otherwise output. Radio interface 54 also provides outbound data from processing module 50 to radio 60. Processing module 50 may receive the outbound data from an input device 59, such as a keyboard, keypad, microphone, et cetera, via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter (ADC) 66, a filtering/gain/attenuation module 68, an intermediate frequency (IF) mixing down conversion stage noted as down-conversion module 70, a receiver filter module 71, a low noise amplifier (LNA) 72, a transmitter/receiver (Tx/Rx) switch module 73, a local oscillation module 74, a memory 75, a digital transmitter processing module 76, a digital-to-analog converter (DAC) 78, a filtering/gain/attenuation module 80, an IF mixing up conversion stage noted as up-conversion module 82, a power amplifier (PA) 84, a transmitter filter module 85, and an antenna 86. The antenna 86 may be a single antenna that is shared by the transmit and receive paths as controlled by Tx/Rx switch 73, or may include separate antennae for the transmit path and receive path (shown by the dotted line). The antenna implementation may depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. Digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when processing module 64 and/or 76 implements one or more of its functions via a state machine, analog circuitry, digital circuitry, and/or logic circuitry, the memory storing the corresponding operational instructions may be embedded with the circuitry comprising the state machine, analog circuitry, digital circuitry, and/or logic circuitry. Memory 75 stores, and the processing module 64 and/or 76 executes, operational instructions that facilitate functionality of the device. In some embodiments, the combination of digital receiver processing module 64, digital transmitter processing module 76 and memory 75 may be referred to together as a "baseband processor."

In operation, radio 60 receives outbound data 94 from host 30 via host interface 62. Host interface 62 routes outbound data 94 to digital transmitter processing module 76, which processes outbound data 94 in accordance with a particular wireless communication standard (e.g., IEEE802.11a, IEEE802.11b, IEEE802.11g, Bluetooth, et cetera) to produce digital transmission formatted data 96. Digital transmission formatted data 96 is typically a digital base-band signal or a digital low IF signal, where the low IF typically may be in the frequency range of one hundred kilohertz to a few megahertz (MHz).

Digital-to-analog converter 78 converts digital transmission formatted data 96 from the digital domain to the analog domain. Filtering/gain/attenuation module 80 filters and/or adjusts the gain of the analog signal prior to providing it to up-conversion module 82 for mixing. Up-conversion module 82 directly converts the analog baseband or low IF signal into an RF signal based on a transmitter local oscillation (Tx LO) 83 provided by local oscillation module 74. Power amplifier 84 amplifies the RF signal to produce outbound RF signal 98, which is filtered by transmitter filter module 85. Antenna 86 propagates outbound RF signal 98 to a targeted device such as a base station, an access point and/or another wireless communication device.

Radio 60 also receives inbound RF signal 88 via antenna 86, which was transmitted by a base station, an access point, or another wireless communication device. Antenna 86 provides inbound RF signal 88 to receiver filter module 71 via Tx/Rx switch 73, where Rx filter 71 bandpass filters inbound RF signal 88. Rx filter 71 provides the filtered RF signal to low noise amplifier 72, which amplifies signal 88 to produce an amplified inbound RF signal. The low noise amplifier 72 provides the amplified inbound RF signal to down-conversion module 70, which directly converts the amplified inbound RF signal into an inbound low IF signal or baseband signal based on a receiver local oscillation (Rx LO) 81 provided by local oscillation module 74. Down-conversion module 70 provides the inbound low IF signal or baseband signal to filtering/gain/attenuation module 68. Filtering/gain/attenuation module 68 may be implemented to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to host device 30 via radio interface 54.

As one of ordinary skill in the art will appreciate, the particular wireless communication device of FIG. 2 may be implemented using one or more integrated circuits. For example, host 30 may be implemented on one integrated circuit and digital receiver processing module 64, digital transmitter processing module 76 and memory 75 may be implemented on a second integrated circuit, and the remaining components of radio 60, less the antenna 86, may be implemented on a third integrated circuit. As an alternative embodiment, radio 60 may be implemented on a single integrated circuit. As yet another alternative embodiment, processing module 50 of host 30 and digital receiver and transmitter processing modules 64 and 76 may be a common processing device implemented on a single integrated circuit. Further, memory 52 and memory 75 may be implemented on a single integrated circuit and/or on the same integrated circuit as the common processing modules of processing module 50 and digital receiver and transmitter processing module 64 and 76.

Figure 3:
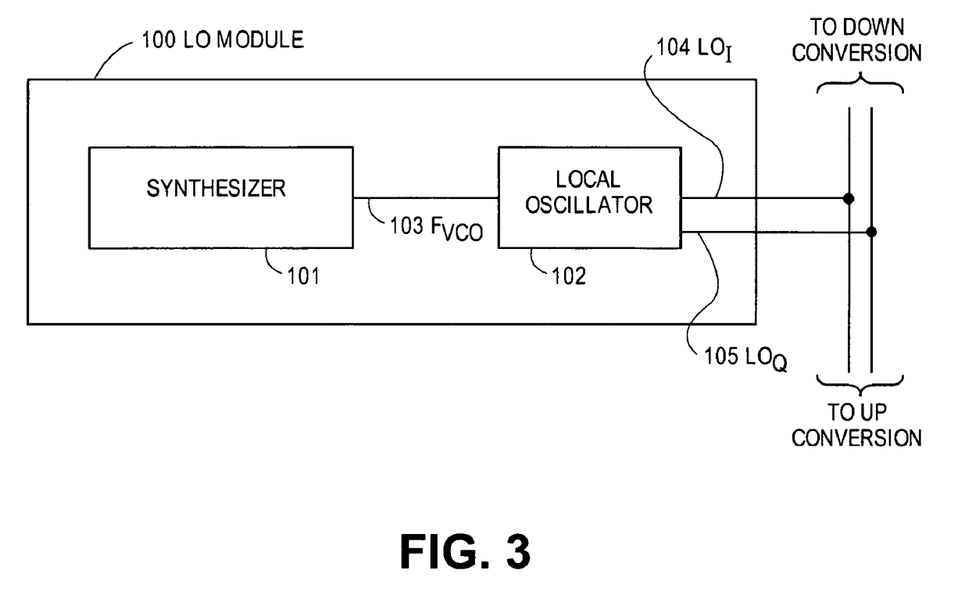
FIG. 3 is a block schematic diagram illustrating one embodiment of a local oscillation module for providing local oscillator frequencies to perform frequency conversion in a radio device.

FIG. 3 shows one embodiment of a local oscillation (LO) module 100, which may be employed as LO module 74 of FIG. 2. LO module 100 includes a synthesizer 101 and a local oscillator circuit 102. Synthesizer 101 generates a voltage controlled oscillator frequency signal ($F_{VCO}$) 103 to local oscillator circuit 102. As will be described below, the frequency of $F_{VCO}$ depends on the channel frequency selected. Circuit 102 receives $F_{VCO}$ and generates LO signals (such as Rx LO and Tx LO in FIG. 2) for mixing with conversion circuits (such as down-conversion module 70 and up-conversion module 82 for the circuit of FIG. 2). Generally, for wireless communications where constellation mapping is employed, LO circuit 102 typically generates an in-phase LO component $LO_I$ 104 and quadrature LO component $LO_Q$ 105 for in-phase I and quadrature Q components of the complex modulation envelope.

Figure 4:
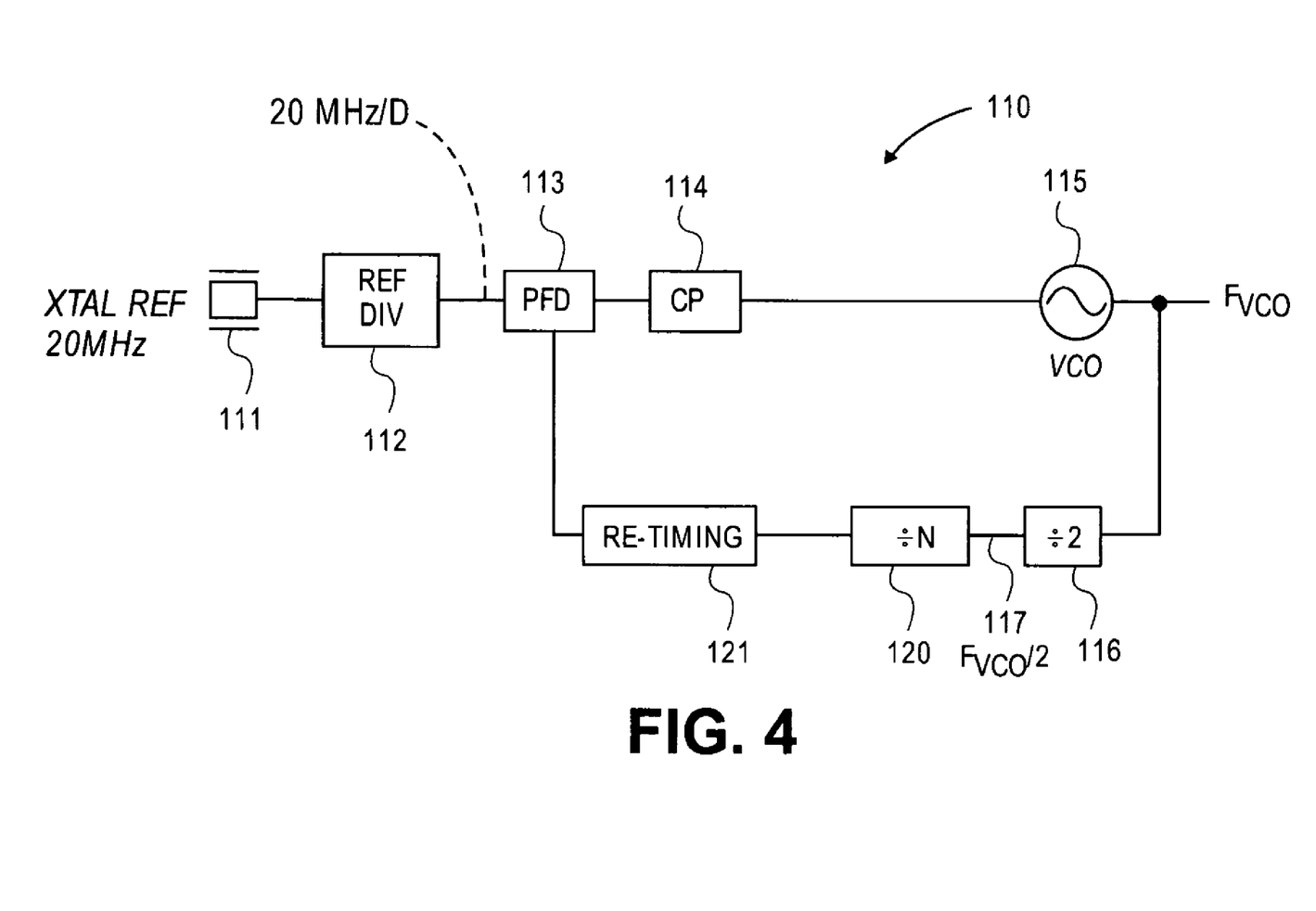
FIG. 4 is a block schematic diagram of one embodiment of a PLL-based synthesizer in which a reference frequency is determined by dividing a clock frequency by a factor of D and in which a divide by 2 circuit and a divide by N circuit are employed in the PLL feedback loop.
Figure 5:
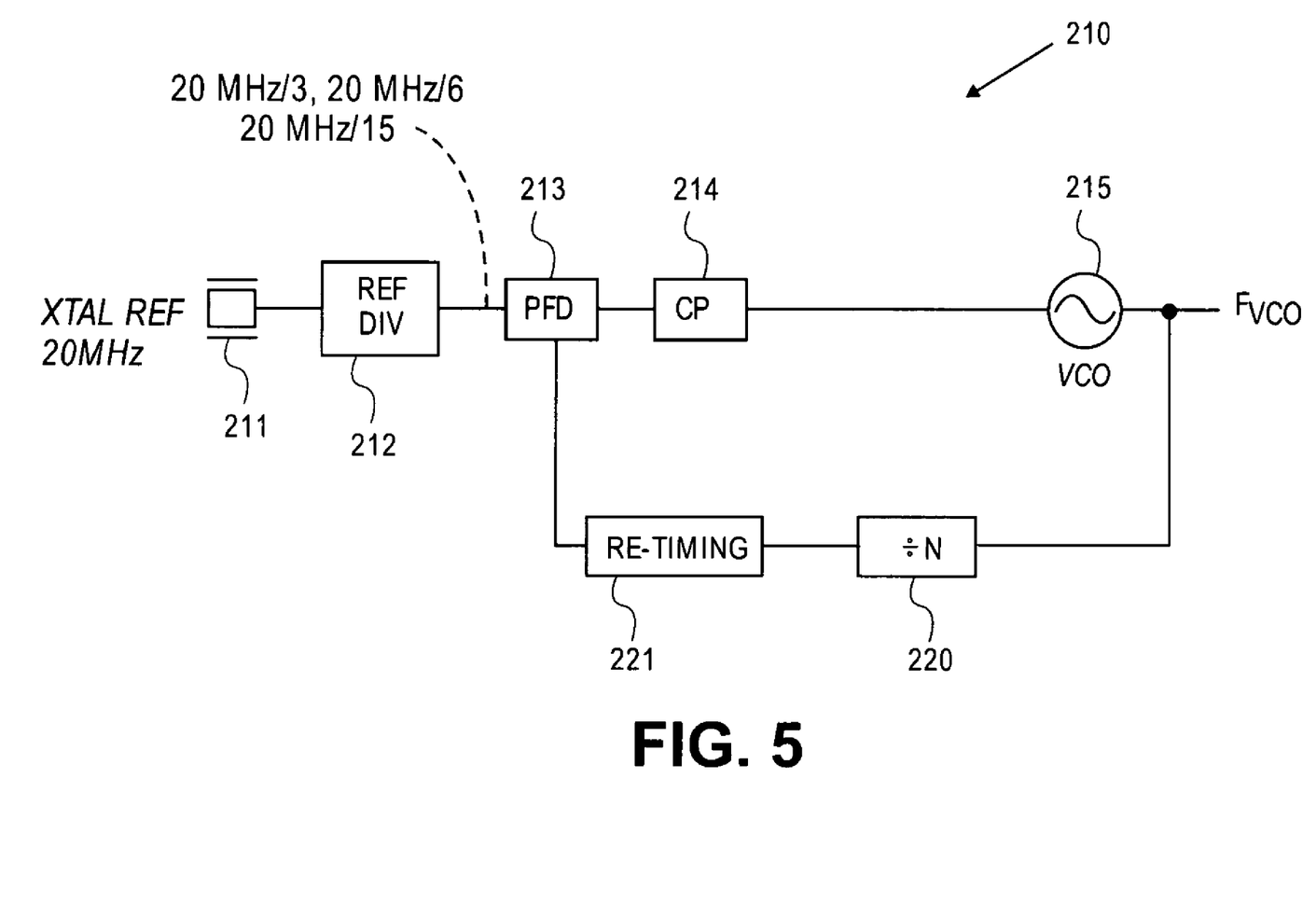
FIG. 5 is a block schematic diagram of another embodiment of a PLL-based synthesizer in which a reference frequency is determined by dividing a clock frequency by factors of 3, 6 and 15 and in which only a divide by N circuit is employed in the PLL feedback loop.

Referring to FIGS. 4-8, FIGS. 4 and 5 illustrate two different phase locked loop (PLL) circuits that may be employed in synthesizer 101 of FIG. 3 and FIGS. 6-8 show various $F_{VCO}$ 103 signals that may be generated, depending on the particular communication standard selected. FIG. 4 shows a PLL-based frequency synthesizer 110 that may be implemented as one embodiment for synthesizer 101 of FIG. 3. FIG. 5 shows a PLL-based frequency synthesizer 210 that may be implemented as another embodiment for synthesizer 101 of FIG. 3.

In the embodiments shown, both synthesizers utilize a reference clock frequency of 20 MHz, which is provided from a clock source 111 or 211. In the particular example, a crystal reference (XTAL REF) is utilized. It is to be noted that other types of clock references may be used. Furthermore, other frequencies may be selected for the clock reference. 20 MHz is utilized in the particular example to generate the various frequencies noted in the tables of FIGS. 6-8.

For synthesizer 110, a divider circuit 112 provides one or more frequency division(s) to the 20 MHz clock signal. The frequency division (or divisions) is noted as D, so that the output of divider circuit is 20 MHz÷D and this divided reference is input to a phase frequency detector (PFD) 113. For synthesizer 210, a divider circuit 212 provides particular frequency divisions of 3, 6 and 15 to the 20 MHz clock signal (shown as 20 MHz/3, 20 MHz/6 and 20 MHz/15) as input to a phase frequency detector (PFD) 213. The outputs of PFDs 113 and 213 are coupled to respective charge pumps (CPs) 114, 214 and their charge outputs are used to drive respective VCO circuits 115, 215 to generate $F_{VCO}$ at the output.

A feedback path exists for the PLLs from the $F_{VCO}$ output back to respective PFD 113, 213. For synthesizer 110, a divide by two (÷2) circuit 116 is used to generate a feedback signal ($F_{VCO}/2$) 117, which is then coupled through a divide by N (÷N) circuit 120 and a re-timing circuit 121 for control loop feedback to PFD 113 at the front end of the PLL. As will be described below, the value selected for N in the feedback path corresponds to a division factor applied to $F_{VCO}/2$ to obtain a frequency value 20 MHZ/D at the output of divider circuit 112.

For synthesizer 210, a divide by two (÷2) circuit is not used in the feedback path, so the feedback signal into a divide by N circuit 220 is $F_{VCO}$. Thus, $F_{VCO}$ is coupled through divide by N (÷N) circuit 220 to a re-timing circuit 221 for control loop feedback to PFD 213 at the front end of the PLL. As noted above, the value selected for N corresponds to a division factor applied to the feedback frequency ($F_{VCO}$ in this instance) to obtain one of the frequency values at the output of divider circuit 212, which is a division of 3, 6 or 15 to the 20 MHz clock signal. It is to be noted that in synthesizer 110, both a divide by two and divide by N circuits are utilized in the feedback path. In synthesizer 210, only the divide by N circuit is used. Re-timing circuit 121 is used to retime the output of divider circuit 120 with its input signal to remove jitter and phase noise injected by divider 120. The same for re-timing circuit 221 with respect to divider 220.

Figure 6:
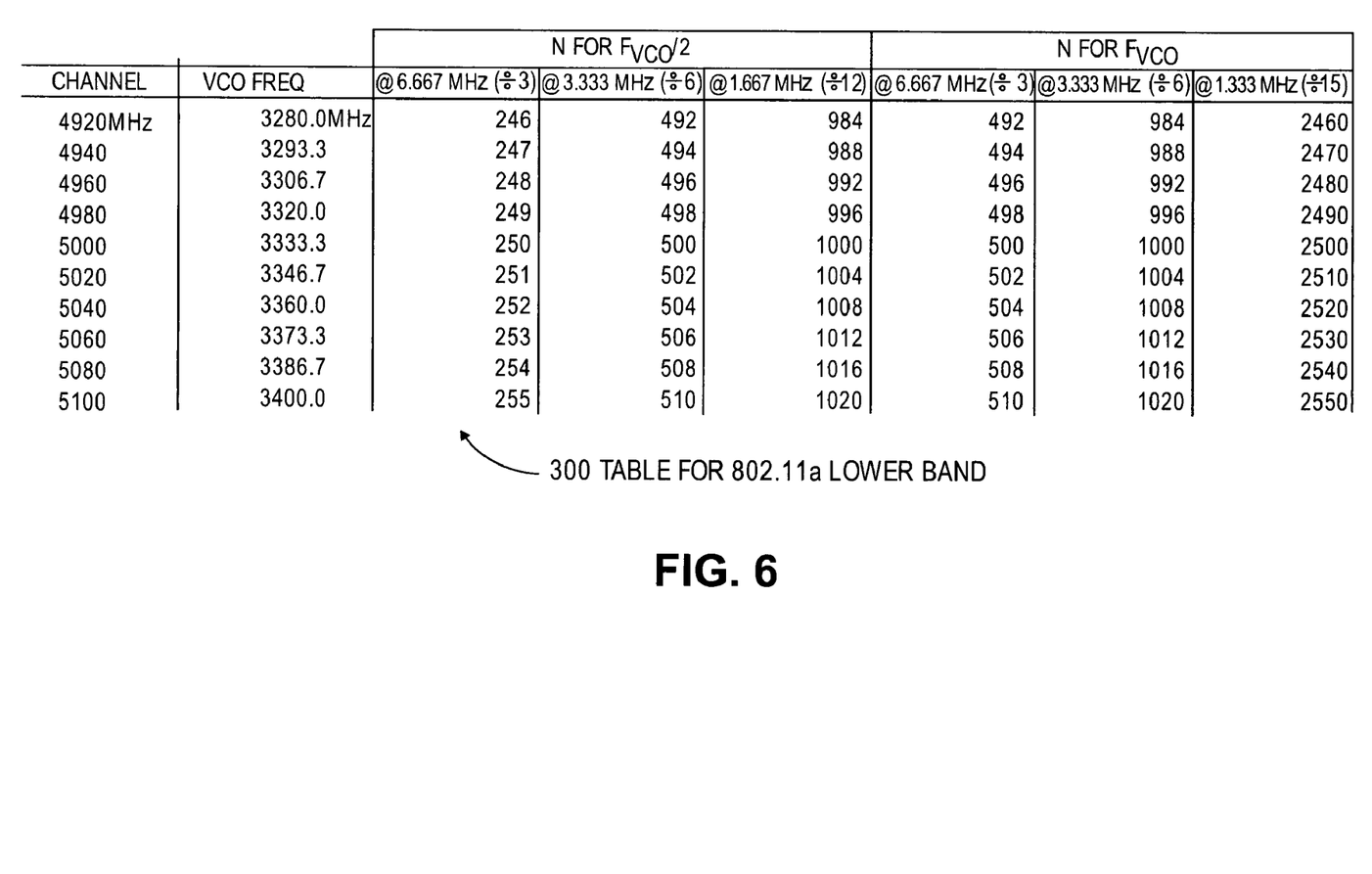
FIG. 6 is a frequency allocation table for the synthesizers of FIGS. 4 and 5 to provide allocation of frequencies for 802.11a lower band based on a feedback factor N.
Figure 7:
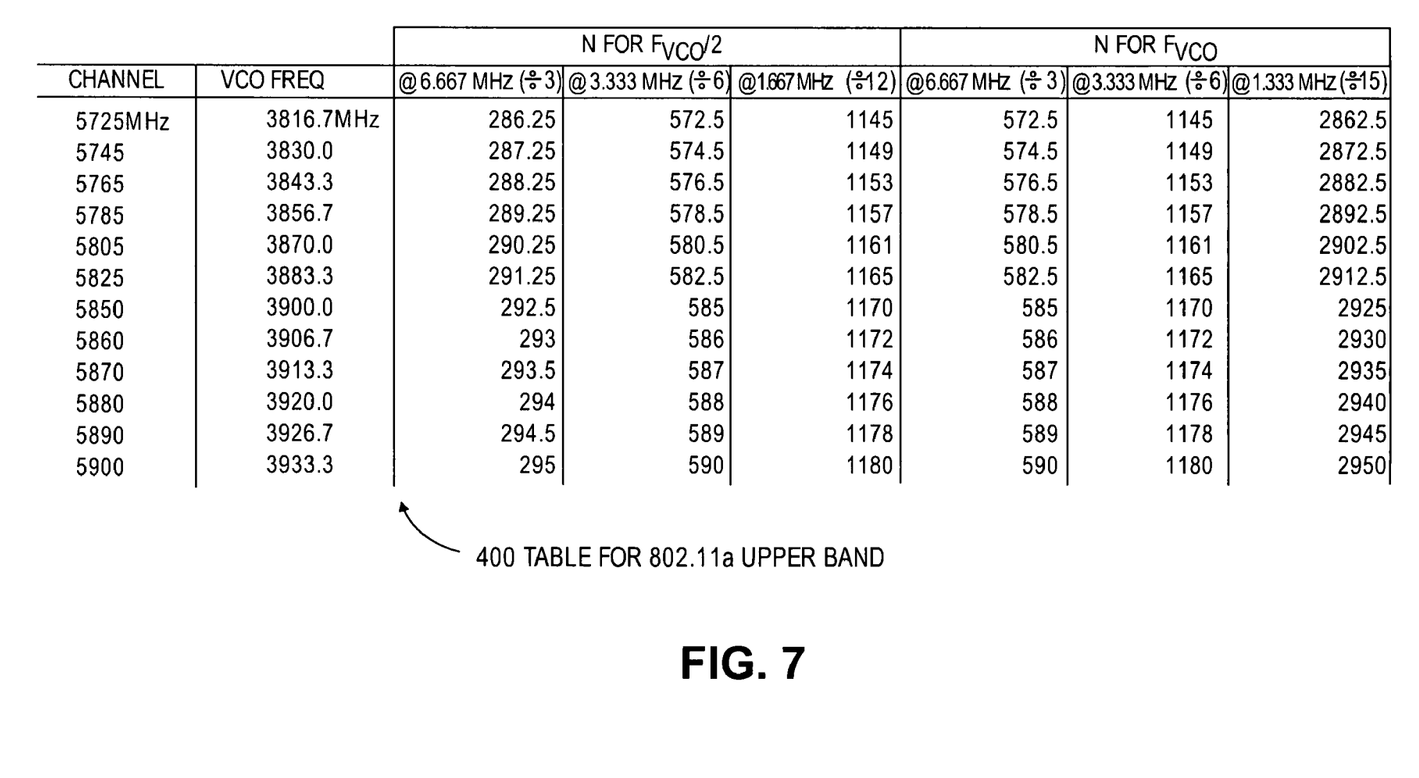
FIG. 7 is a frequency allocation table for the synthesizers of FIGS. 4 and 5 to provide allocation of frequencies for 802.11a upper band based on a feedback factor N.
Figure 8:
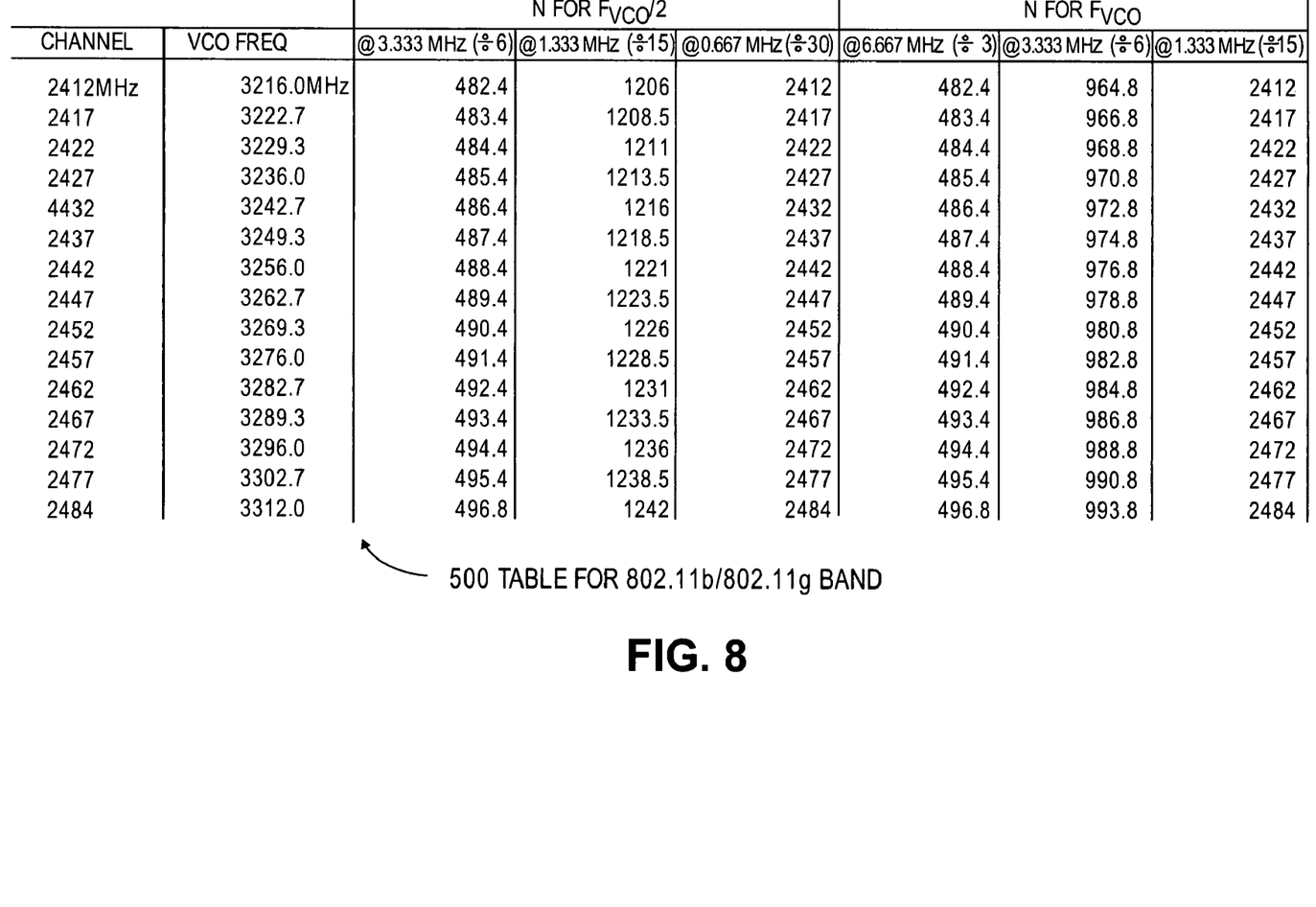
FIG. 8 is a frequency allocation table for the synthesizers of FIGS. 4 and 5 to provide allocation of frequencies for 802.11b/g band based on a feedback factor N.

In one application, the PLL circuits of FIGS. 3 and 4 are used to provide VCO frequencies which drive local oscillators to operate on channel frequencies pertaining to the 802.11a communication standard and for the 802.11b/802.11g communication standards. As will be described below, for the various 802.11 standards discussed, synthesizer 210 has certain advantages over synthesizer 110 in generating the VCO frequencies. The frequency tables of FIGS. 6-8 show the various example frequencies for synthesizer 110 and 210 that may be generated corresponding to channel frequencies for 802.11a lower band, 802.11a upper band and 802.11b/g band standards. Furthermore, synthesizer 110 generates various VCO frequencies corresponding to channel frequencies for the noted 802.11 standards by changing the reference division of the 20 MHZ clock signal out of circuit 112. On the other hand, synthesizer 210 provides frequency divisions of 3, 6 and 15 to the 20 MHz clock signal for all channel frequencies of the noted 802.11 standards.

In reference to FIG. 6, table 300 shows a portion of the frequencies pertaining to the lower band range of the 802.11a standard. The band range is approximately from 4920 MHz to 5700 MHz, with 20 MHz spacing between the channels. The left most column of table 300 shows some of the channel frequencies for 802.11a lower band, commencing at 4920 MHz. The second column of table 300 shows output frequency of the VCO ($F_{VCO}$) corresponding to the channel frequencies. In the particular embodiment shown, $F_{VCO}$ is established as ⅔ of the channel frequency $F_{CH}$, so that $F_{VCO}=⅔ F_{CH}$ (or $F_{CH}=1.5 F_{VCO}$).

The next three columns to the right of the $F_{VCO}$ column show three possible reference frequencies for synthesizer 110. The three reference frequencies for synthesizer 110 are noted as 6.667 MHz, 3.333 MHz and 1.667 MHz, corresponding to divisions of 3, 6 and 12 of the 20 MHz clock signal. The numbers in the columns under the three reference frequencies denote values for N in the feedback path of synthesizer 110 for the respective frequencies. Thus, the particular N value shown is the dividing factor for circuit 120 in the feedback path for the PLL, when the divide by 2 circuit 116 is employed. For example, for a channel frequency of 4940 MHz in Table 300, $F_{VCO}$ is 3293.3 MHz ((⅔)×4940 MHz). If the reference frequency is set at 6.667 MHz (20 MHz÷3), then the value for N in the feedback is 247 ((3293.3 MHz÷2)÷N=6.667 MHz). If the reference frequency is set at 3.333 MHz (20 MHz÷6), the value for N is 494 ((3293.3÷2)÷N=3.333 MHz). If the reference frequency is set at 1.667 MHz (20 MHz÷12), then the value for N is 988 ((3293.3 MHz÷2)÷N=1.667 MHz. The other values for N in the three columns are calculated in the same manner for the other channel frequencies listed in table 300.

Next, the three right most columns of table 300 pertain to the three reference frequencies that are applicable to synthesizer 210 and the N values pertain to the divide by N operation of circuit 220. For synthesizer 220, the reference frequencies are set at 6.667 MHz (20 MHz÷3), 3.333 MHz (20 MHz÷6) and 1.333 MHz (20 MHz÷15), which correspond to the last three columns, respectively. For the same channel frequency of 4940 MHz, the corresponding N values are 494 (3293.3 MHz÷N=6.667 MHz), 988 (3293.3 MHz÷N=3.333 MHz) and 2470 (3293.3 MHz÷N=1.333 MHz). Note that for synthesizer 220, the reference frequencies are set to a fixed division of 3, 6 and 15 and no divide by 2 circuit is included in the PLL feedback loop.

It is to be noted that the value of N selected for a particular channel is to be of an integer value. That is, integer division is employed in the divide by N circuits 120, 220. Since all of the N values noted in table 300 are integers, synthesizer 110 may use any of the three frequencies (6.667 MHz, 3.333 MHz and 1.667 MHz) under N for $F_{VCO}/2$ columns. Likewise, synthesizer 210 may use any of the three reference frequencies (6.667 MHz, 3.333 MHz and 1.333 MHz) under N for $F_{VCO}$ columns. However, for operation of synthesizers 110, 210, it is generally desirable to obtain the highest reference frequency available out of the PFD circuit 113, 213, in order to obtain a wider bandwidth for the PLL. That is, $F_{BW}=F_{PFD}/X$, where FBW is the bandwidth for the PLL, $F_{PFD}$ is the frequency into a PFD circuit and X is some constant for the circuit that relates $F_{BW}$ to $F_{PFD}$. In one embodiment, in order to keep the phase lock loop stable and reference feedthrough low, a minimum value of the ratio $X=F_{PFD}/F_{BW}$ is typically chosen to be larger than 6.

Accordingly, for both synthesizers 110, 210, the reference divider may be set at 3 for a reference frequency of 6.667 MHz, since this is the highest frequency noted in table 300 for both synthesizers and the N values are integers. For example, when synthesizer 210 is utilized, the reference division is set at 3 and the N value in the feedback divider for 802.11a lower band may be calculated to fall within the approximate range of $(2/3)F_{CH}/(20 \text{ MHz}/3)=F_{CH}/10 \text{ MHz}=492 \text{ to } 570$.

Note that table 300 only shows channel frequencies up to 5100 MHz, but the remaining channel frequencies and the corresponding N values follow the pattern shown.

FIG. 7 shows a table 400 which pertains to frequencies of 802.11a upper band range of 5725 MHz to 5900 MHz approximately. Again, $F_{CH}=1.5\ F_{VCO}$ and the columns denote respective values for N in the feedback loop of the synthesizers 110, 210 for the same reference frequencies noted in table 300. The reference frequencies noted in table 400 are the same as the reference frequencies of table 300 of FIG. 6. However, because the channel and VCO frequencies have changed, the divider value N has also changed. In this instance, some of the N values are now non-integers and not desirable for use in the feedback loop.

As noted in table 400, for synthesizer 110, the column exhibiting all integer values for N corresponds to the reference frequency of 1.667 MHz (N for $F_{VCO}/2$@ 1.667 MHz). For the channel frequencies at and above 5850 MHz, it is possible to use the reference frequency of 3.333 MHz, since the N values are integers. However, for channel frequencies under 5825 MHz and under, the only alternative is the reference frequency of 1.667 MHz for the example reference frequencies for synthesizer 110. Thus, with the particular example shown for the reference frequencies for synthesizer 110 in table 400, reference frequency of 1.667 MHz is the selected frequency, which is obtained by employing a divide by 12 operation to the 20 MHz clock. In an alternative embodiment, for those channel frequencies above 5858 MHz, a reference frequency of 3.333 MHz may be used.

In contrast, synthesizer 210 may use a reference frequency of 3.333 MHz, since all of the N values are integers within this column (N for $F_{VCO}$@ 3.333 MHz). Alternatively, for those channel frequencies at and above 5850 MHz, the reference frequency of 6.667 MHz may be used. Thus, it is evident that synthesizer 210 allows the use of higher reference frequencies over synthesizer 110 using the same $F_{VCO}$. Since the reference frequencies that may be used are higher, synthesizer 210 has higher bandwidth over synthesizer 110, even though the generated $F_{VCO}$ are the same.

Thus, for 802.11a upper band, synthesizer 210 may use the reference division of 6 ($F_{PFD}$=20 MHz/6) and the feedback divider value N is determined as $(2/3)F_{CH}/(20 \text{ MHz}/6)=F_{CH}/5 \text{ MHz}=1145 \text{ to } 1180$ approximately.

As noted above, $F_{CH}$ range of 5850 to 5900 MHz may utilize a higher reference frequency, so that the N value calculation may be made as:

$(2/3)F_{CH}/(20 \text{ MHz}/6)=F_{CH}/5 \text{ MHz=app. } 1145 \text{ to } 1165$, for $F_{CH}$ of app. 5725-5825 MHz and $(2/3)F_{CH}/(20 \text{ MHz}/3)=F_{CH}/10 \text{ MHz=app. } 585 \text{ to } 590$, for $F_{CH}$ of app 5850-5900 MHz.

It is to be noted that the separation between 5825 MHz and 5850 MHz occurs due to the difference in the $F_{CH}$ separation. In the lower range, the channels are spaced by 20 MHz with a xxx5 MHz center. In the upper range at and above 5850 MHz, the channels are spaced by 10 MHz with a xxx0 MHz center.

FIG. 8 shows a table 500 which pertains to frequencies of 802.11b and 802.11g (802.11b/g) band of 2412 MHz to 2477 MHz approximately, with 5 MHz spacing, plus 2484 MHz. Since $F_{CH}$ for 802.11b/g is much lower than 802.11a, a different $F_{CH}$ to $F_{VCO}$ relationship is utilized. In this instance for 802.11b/g, the relationship is set at:

$F_{CH}=\frac{1}{2}(1.5F_{VCO})$ or $F_{CH}=\frac{3}{4}F_{VCO}$

Again, the reference frequencies pertaining to synthesizers 110 and 210 are shown in table 500. In this particular example, the reference frequencies selected for synthesizer 110 are 3.333 MHz (20 MHz÷6), 1.333 MHz (20 MHz÷15) and 0.667 MHz (20 MHz÷30) approximately. The reference frequencies for synthesizer 210 have not changed.

The applicable values for the feedback divider N for synthesizer 110 are noted in the three middle columns and for synthesizer 210 are noted in the three right most columns. As noted in table 500, integer values for N are available only under the 0.667 MHz column for synthesizer 110 and only under the 1.333 MHz column for synthesizer 210. Thus, the reference frequency $F_{PFD}$ selected for synthesizer 110 is 0.667 MHz, while the reference frequency $F_{PFD}$ selected for synthesizer 210 is 1.333 MHz. Since synthesizer 210 has the higher available reference frequency for the feedback divider N, synthesizer 210 provides higher bandwidth for the PLL, as compared to synthesizer 110.

Thus, the divider value for the clock is set to 15, so that $F_{PFD}$=20 MHz/15 and the feedback divider value N is obtained by $(4/3)F_{CH}/(20 \text{ MHz}/15)=F_{CH}/1 \text{ MHz=2412 to 2477}$ approximately, and having an increment of 5, except at the last value of 2484.

As noted above, various embodiments may be implemented to provide the channel frequencies of the 802.11 standard. A PLL architecture that implements a VCO that may be manipulated to produce channel frequencies for 802.11a and 802.11b/g are noted in the examples above. A VCO frequency allocation scheme that allows a single synthesizer to generate the VCO frequencies for 802.11a and 802.11b/g is exemplified in the tables of FIGS. 6-8. In particular, synthesizer 210 exemplifies an embodiment in which one set of reference frequencies obtained from a division of 3, 6 and 15 of a 20 MHz clock signal allows generation of VCO signals for various channel frequencies for 802.11a and 802.11b/g. 20/3 (6.667) MHz is used as the reference frequency for 802.11a lower band, 20/6 (3.333) MHz is used as the reference frequency for 802.11a upper band and 20/15 (1.333) MHz is used as the reference frequency for 802.11b/g. This allocation scheme is based on the feedback divider value N being an integer at the respective channel frequencies. As noted above in table 400, in an alternative embodiment, 802.11a upper band may use both 6.667 MHz and 3.333 MHz as $F_{PFD}$, depending on the higher or lower portion of the channel frequency band.

It is appreciated that although the same VCO frequencies noted in the allocation scheme of FIGS. 6-8 may be employed by synthesizer 110, the bandwith obtained is generally less. That is, synthesizer 210 allows the use of higher reference frequencies than synthesizer 110, so that higher PLL loop bandwidth is generally obtained with synthesizer 210. Higher loop bandwidth is advantageous since it may provide more filtering for phase noise from the VCO. It is generally understood that phase noise from a VCO is a significant noise contributor in a PLL and any improvement in noise filtering improves the signal-to-noise ratio of the PLL.

Furthermore, in one embodiment for employing synthesizer 210, current $I_{CP}$ into CP 214 may be set at 5 mA for a $K_{VCO}$ of 30 MHz per volt from VCO 215 to generate a VCO frequency ($F_{VCO}$) of approximately 3 to 4 GHz. Typically, minimum $K_{VCO}$ is limited by ability of VCO calibration and maximum $I_{CP}$ is limited by power consumption and area of the integrated circuit. It is to be noted that $I_{CP}$ refers to the charge pump current and $K_{VCO}$ refers to the sensitivity of the VCO output frequency when its control voltage changes.

By designing the synthesizer as noted above, particularly synthesizer 210, a transceiver unit may be designed for combinational operation in different bands, such as 802.11a, 802.11b and 802.11g with improved noise rejection in the PLL generating the local oscillation signal(s). Such a transceiver may be employed in the device of FIG. 2, which may be present in one or more wireless devices shown in FIG. 1.

Furthermore, it is to be noted that the relationship of $F_{VCO}$ to $F_{CH}$ in the example above is based on the ratios of 3/2 and 3/4. However, other relationships between $F_{VCO}$ and $F_{CH}$ may be used in other embodiments. One of the reasons for the selection of the particular ratios of 3/2 and 3/4 is to allow the use of a single VCO to provide $F_{VCO}$ across different frequency bands of communication protocols or standards, such as the IEEE 802.11. Another one of the reasons is to offset the VCO from the output frequency of a power amplifier of a transmitter to avoid a pulling effect.

Single VCO Operation to Generate Sets of Channel Frequencies

Figure 9:
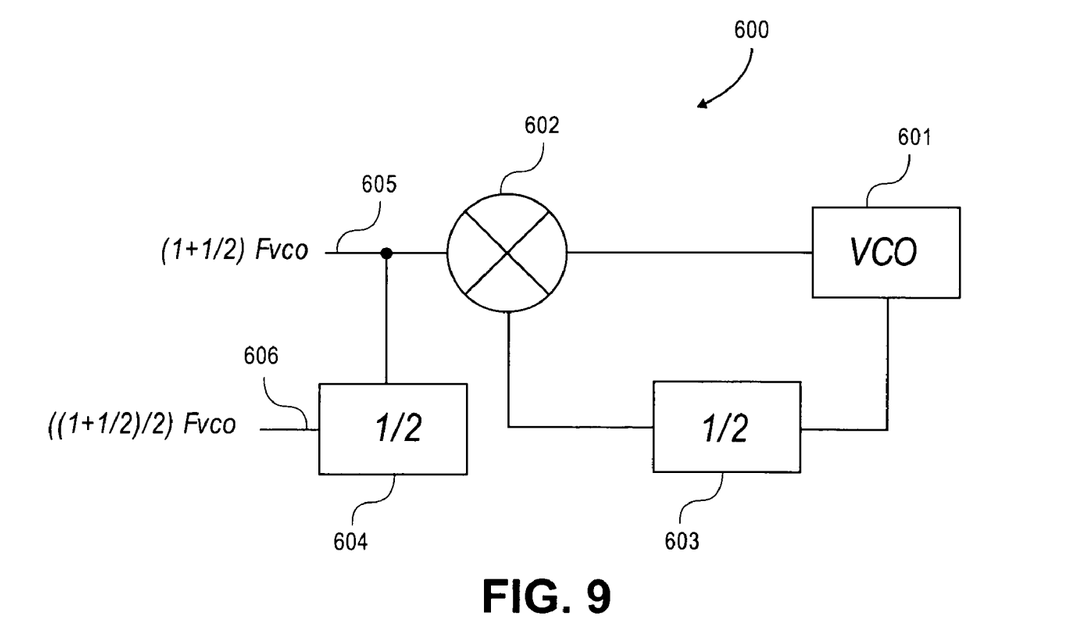
FIG. 9 is a block schematic diagram of an oscillation module illustrating generations of different oscillator channel frequencies from a single VCO source.

In the frequency allocation scheme noted above and exemplified in tables 300, 400, 500, $F_{VCO}$ and $F_{CH}$ have different proportional relationship depending on the band selected. For 802.11a, $F_{CH}=(3/2)F_{VCO}$. However, for 802.11b/g, $F_{CH}=(3/4)F_{VCO}$. This relationship is utilized so that 802.11a and 802.11b/g channel frequencies may be generated using $F_{VCO}$ in the range 3-4 GHz. FIG. 9 illustrates one example embodiment for generating the requisite channel frequencies from a single VCO operating in the approximate range of 3-4 GHz.

In FIG. 9, oscillator circuit 600 is shown having a VCO 601 feeding its output $F_{VCO}$ into a mixer 602. $F_{VCO}$ is also coupled to a divide by 2 (½ multiplier) circuit 603, which output is also coupled to mixer 602. The two signals are mixed in mixer 602 and the upper combination of the two mixed signals ($F_{VCO}+½ F_{VCO}$) is taken as the output 605. As mathematically noted, output 605 is 1.5 $F_{VCO}$, which corresponds to the local oscillator channel frequency $F_{CH}$ for 802.11a.

Output 605 from mixer 602 is also coupled to another divide by 2 (½ multiplier) circuit 604 which output is (1.5/2) $F_{VCO}$, which is ¾ $F_{VCO}$. Accordingly, output 605 corresponds to the local oscillator channel frequency $F_{CH}$ for 802.11b/g. Thus, by utilizing a single VCO that generates $F_{VCO}$ in the range of 3-4 GHz, local oscillation signals may be generated for 802.11a and 802.11b/g.

It is to be noted that circuit 600 may be employed by using synthesizer circuit 110 or 210 for VCO 601 to generate the requisite $F_{VCO}$. Furthermore, an embodiment of circuit 600 may be employed in LO module 100 of FIG. 3 to generate the requisite $LO_I$ and $LO_Q$ signals from local oscillator 102.

Figure 10:
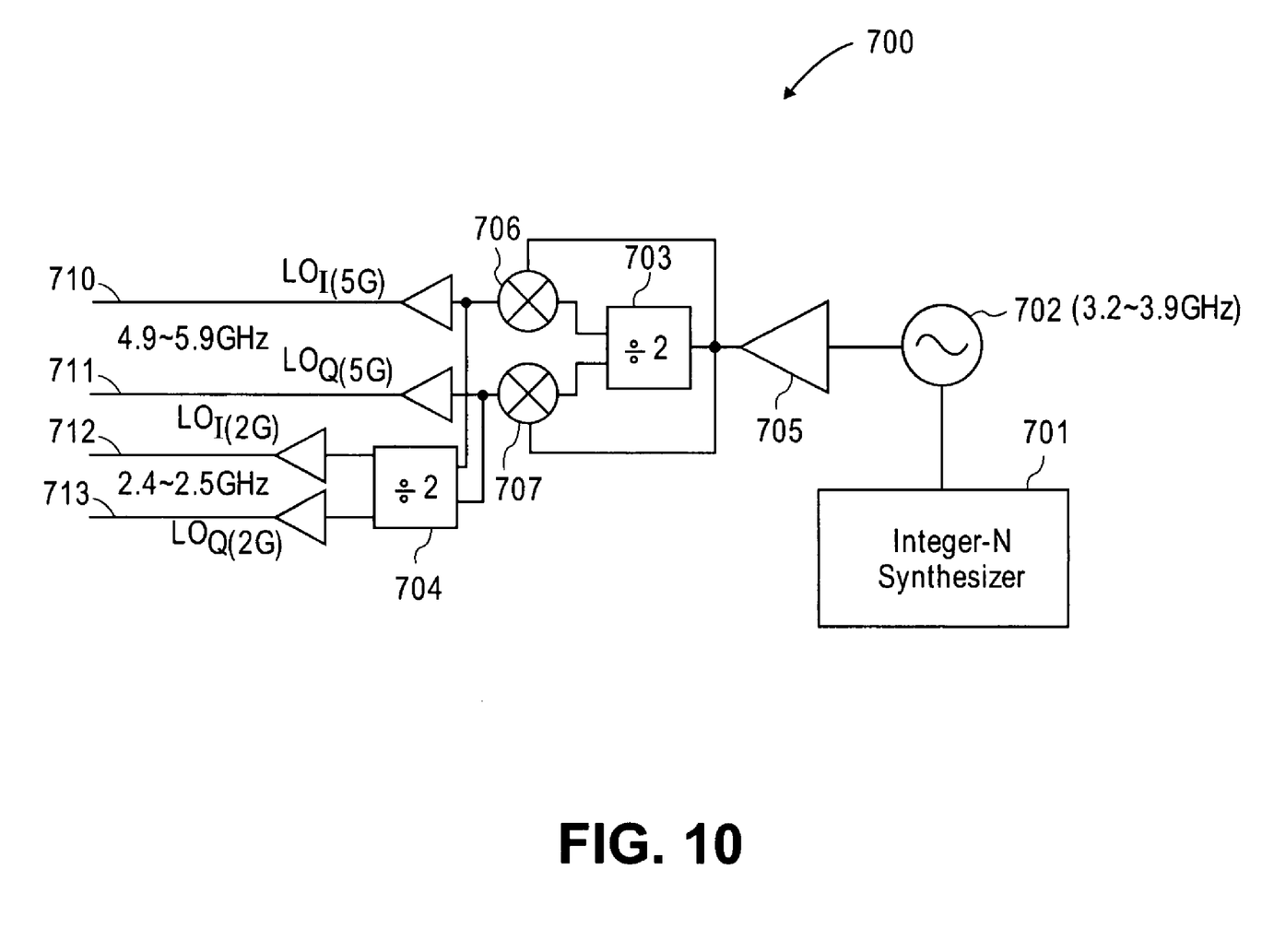
FIG. 10 is a block schematic diagram illustrating one embodiment of implementing the oscillation module of FIG. 9 to generate I and Q components for the radio shown in FIG. 2.

FIG. 10 illustrates one example embodiment of LO module 700, comprised of an Integer-N synthesizer 701, which generates a $F_{VCO}$ 702 that is amplified by amplifier 705 and fed to mixers 706 and 707. $F_{VCO}$ 702 is also fed through a divide by 2 circuit 703, which output is also coupled to mixers 706, 707. Divide by 2 circuit 703 and mixers 706, 707 operate equivalently to divide by 2 circuit 603 and mixer 602 of FIG. 9, to generate the oscillator channel frequency (3/2) $F_{VCO}$. In circuit 700, mixer 706 generates the in-phase component $LO_I(5G)$ 710 for the 802.11a band, while mixer 707 generates the out-of-phase quadrature component $LO_Q$ (5G) 711 for the 802.11a band.

The outputs of mixers 706, 707 are also coupled to a divide by 2 circuit 704 to further divide the (3/2) $F_{VCO}$ signal to generate ¾ $F_{VCO}$. Divide by 2 circuit 704 operate equivalently to divide by 2 circuit 604 of FIG. 9, to generate the oscillator channel frequency ¾ $F_{VCO}$. In-phase component $LO_I(2G)$ 712 and quadrature component $LO_Q(2G)$ 713 for the 802.11b/g band are output from divider 704.

Module 700 may be employed as one embodiment of LO module 100 of FIG. 3, in which synthesizer 701 is employed as synthesizer 101 and the remaining circuitry of module 700 employed as local oscillator 102. Output combinations 710/711 or 712/713 are selected as output pairs 104/105 depending on which band is selected. As noted, LO module 100 then may be implemented as LO module 74 of radio 60 of FIG. 2. Thus, a single VCO may be utilized to generate the requisite oscillator channel frequencies to perform up-conversion and/or down-conversion in processing signals in a radio unit. As noted, such a radio may be utilized in a wireless communication device. By designing a synthesizer with a single VCO to cover the required band(s), transceiver power consumption in an integrated circuit may be reduced, as well as saving space on a chip area.

Thus, a frequency allocation scheme is described in which a particular PLL architecture allows for improved performance across multiple bands and in which a single VCO may be utilized to generate requisite oscillator frequencies for the band channels.

We claim:

1. An apparatus comprising:
   a voltage controlled oscillator (VCO) to generate a VCO output having a frequency $F_{VCO}$; and
   a divider network coupled to the VCO to generate a first oscillator signal having a first oscillator frequency for operating on a first band of frequencies of a 802.11 communication standard and to generate a second oscillator signal having a second oscillator frequency for operating on a second band of frequencies of the 802.11 communication standard, wherein $F_{CH}$ is a channel frequency of the 802.11 standard, in which the first oscillator frequency is determined by a relationship of $F_{CH}=1.5\ F_{VCO}$ and the second oscillator frequency is determined by a relationship of $F_{CH}=\frac{3}{4}F_{VCO}$.

2. The apparatus of claim 1 wherein the first oscillator signal is applied to a band of frequencies of a 802.11 a communication standard and the second oscillator signal is applied to a band of frequencies of 802.11 b and 802.11 g communication standards.

3. An apparatus comprising:
a voltage controlled oscillator (VCO) to generate a VCO output having a frequency $F_{VCO}$;
a first divide by two circuit coupled to receive the VCO output and to perform a divide by two operation to output a ½ $F_{VCO}$ signal;
a mixer coupled to receive the VCO output of $F_{VCO}$ and ½ $F_{VCO}$ signal and to mix and generate a 1.5 $F_{VCO}$ signal at the mixer output as a first oscillator signal; and
a second divide by two circuit coupled to receive the 1.5 $F_{VCO}$ signal from the mixer and to perform a divide by two operation to output a ¾ $F_{VCO}$ signal as a second oscillator signal.

4. The apparatus of claim 3 wherein the first oscillator signal is applied to one band of frequencies of a 802.11 communication standard and the second oscillator signal is applied to another band of frequencies of the 802.11 communication standard.

5. The apparatus of claim 3 wherein the first oscillator signal is applied to a band of frequencies of a 802.11 a communication standard and the second oscillator signal is applied to a band of frequencies of 802,11 b and 802.11 g communication standards.

6. The apparatus of claim 3 wherein the first and second oscillator frequencies correspond to channel frequencies of a 802.11 communication standard.

7. The apparatus of claim 3 wherein $F_{CH}$ is a channel frequency of the 802.11 standard, in which the first oscillator frequency is determined by a relationship of $F_{CH}=1.5\ F_{VCO}$ to provide oscillator frequencies for 802.11a and the second oscillator frequency is determined by a relationship of $F_{CH}=\frac{3}{4}\ F_{VCO}$ to provide oscillator frequencies for 802.11b and 802.11g.

8. The apparatus of claim 7 wherein $F_{VCO}$ is in the approximate range of 3.2 to 3.9 GHz, the first oscillator signal has a frequency in the approximate range of 4.9 to 5.9 GHz and the second oscillator signal has a frequency in the approximate range of 2.4 to 2.5 GHz.

9. The apparatus of claim 7 wherein the first and second oscillator signals each include in-phase I and quadrature Q components.

10. A method comprising:
generating a voltage controlled oscillator (VCO) output having a frequency $F_{VCO}$;
dividing by two the VCO output to generate a ½ $F_{VCO}$ signal;
mixing the VCO output of $F_{VCO}$ and the ½ $F_{VCO}$ signal to generate a 1.5 $F_{VCO}$ signal as a first oscillator signal; and
dividing by two the 1.5 $F_{VCO}$ signal to generate a ¾ $F_{VCO}$ signal as a second oscillator signal.

11. The method of claim 10 further including applying the first oscillator signal to one band of frequencies of a 802.11 communication standard and the second oscillator signal to another band of frequencies of the 802.11 communication standard.

12. The method of claim 11 further including applying the first oscillator signal to a band of frequencies of a 802.11 a communication standard and the second oscillator signal to a band of frequencies of 802,11 b and 802.11 g communication standards.

13. The method of claim 12 wherein $F_{VCO}$ is in the approximate range of 3.2 to 3.9 GHz, the first oscillator signal has a frequency in the approximate range of 4.9 to 5.9 GHz and the second oscillator signal has a frequency in the approximate range of 2.4 to 2.5 GHz.

14. The method of claim 13 further including generating in-phase I and quadrature Q components for the first and second oscillator signals.

* * * * *

UNITED STATES PATENT AND TRADEMARK OFFICE
CERTIFICATE OF CORRECTION

| | | |
|---|---|---|
| PATENT NO. | : 7,379,722 B2 | Page 1 of 1 |
| APPLICATION NO. | : 11/060325 | |
| DATED | : May 27, 2008 | |
| INVENTOR(S) | : Hung-Ming Chien and Keith A. Carter | |

It is certified that error appears in the above-identified patent and that said Letters Patent is hereby corrected as shown below:

Column 13, line 33, in Claim 5: replace "802,11 b" with --802.11 b--.

Column 14, line 30, in Claim 12: replace "802,11 b" with --802.11 b--.

Signed and Sealed this

Twenty-fourth Day of March, 2009

JOHN DOLL
*Acting Director of the United States Patent and Trademark Office*